United States Patent
Oh et al.

(10) Patent No.: US 8,136,017 B2
(45) Date of Patent: Mar. 13, 2012

(54) MULTI-LAYER SEMICONDUCTOR MEMORY DEVICE COMPRISING ERROR CHECKING AND CORRECTION (ECC) ENGINE AND RELATED ECC METHOD

(75) Inventors: Hyung-rok Oh, Yongin-si (KR); Sang-beom Kang, Hwaseong-si (KR); Woo-yeong Cho, Suwon-si (KR); Joon-min Park, Dongjak-gu (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 1052 days.

(21) Appl. No.: 12/036,414

(22) Filed: Feb. 25, 2008

(65) Prior Publication Data

US 2008/0212352 A1  Sep. 4, 2008

(30) Foreign Application Priority Data

Mar. 2, 2007 (KR) .................. 10-2007-0021171

(51) Int. Cl.
*G11C 29/00* (2006.01)
(52) U.S. Cl. ...................... 714/773; 714/766
(58) Field of Classification Search .................. 714/766, 714/773
See application file for complete search history.

(56) References Cited

U.S. PATENT DOCUMENTS

| | | | | |
|---|---|---|---|---|
| 4,692,923 A * | 9/1987 | Poeppelman | ................. | 714/702 |
| 4,730,320 A * | 3/1988 | Hidaka et al. | ................. | 714/766 |
| 5,012,472 A * | 4/1991 | Arimoto et al. | ................ | 714/754 |
| 5,056,095 A * | 10/1991 | Horiguchi et al. | ............ | 714/765 |
| 5,117,428 A * | 5/1992 | Jeppesen et al. | ................. | 714/45 |
| 5,274,645 A * | 12/1993 | Idleman et al. | ................. | 714/6.1 |
| 5,313,425 A * | 5/1994 | Lee et al. | ........................ | 365/201 |
| 5,333,143 A * | 7/1994 | Blaum et al. | ................... | 714/766 |
| 5,502,667 A * | 3/1996 | Bertin et al. | ...................... | 365/51 |
| 5,915,167 A * | 6/1999 | Leedy | ........................... | 438/108 |
| 6,070,262 A * | 5/2000 | Kellogg et al. | ................ | 714/763 |
| 6,133,640 A * | 10/2000 | Leedy | ............................ | 257/778 |
| H1915 H * | 11/2000 | Boone et al. | ....................... | 365/2 |
| 6,208,545 B1 * | 3/2001 | Leedy | .............................. | 365/51 |
| 6,397,290 B1 * | 5/2002 | Williams et al. | .............. | 711/105 |
| 6,551,857 B2 * | 4/2003 | Leedy | ............................ | 438/109 |
| 6,591,394 B2 * | 7/2003 | Lee et al. | ....................... | 714/766 |
| 6,598,199 B2 * | 7/2003 | Tetrick | .......................... | 714/766 |
| 6,753,561 B1 | 6/2004 | Rinerson et al. | | |
| 6,851,081 B2 * | 2/2005 | Yamamoto | ..................... | 714/763 |
| 6,909,632 B2 | 6/2005 | Rinerson et al. | | |
| 6,928,590 B2 * | 8/2005 | Ilkbahar et al. | ................. | 714/49 |
| 7,096,407 B2 * | 8/2006 | Olarig | ........................... | 714/768 |
| 7,134,066 B2 * | 11/2006 | Hassner et al. | ................ | 714/766 |

(Continued)

FOREIGN PATENT DOCUMENTS

KR  1019970006600  4/1997

(Continued)

*Primary Examiner* — Joseph D Torres
(74) *Attorney, Agent, or Firm* — Volentine & Whitt, PLLC

(57) ABSTRACT

Embodiments of the invention provide a multi-layer semiconductor memory device and a related error checking and correction (ECC) method. The multi-layer semiconductor memory device includes first and second memory cell array layers, wherein the first memory cell array layer stores first payload data. The multi-layer semiconductor memory device also includes an ECC engine selectively connected to the second memory cell array layer and configured to receive the first payload data, generate first parity data corresponding to the first payload data, and store the first parity data exclusively in the second memory cell array layer.

10 Claims, 8 Drawing Sheets

U.S. PATENT DOCUMENTS

| | | | |
|---|---|---|---|
| 7,277,336 B2 * | 10/2007 | Ilkbahar et al. | 365/200 |
| 7,330,370 B2 * | 2/2008 | Rinerson et al. | 365/158 |
| 7,373,564 B2 * | 5/2008 | Kikutake et al. | 714/718 |
| 7,543,211 B2 * | 6/2009 | Nahas et al. | 714/752 |
| 7,545,689 B2 * | 6/2009 | Ilkbahar et al. | 365/200 |
| 7,558,096 B2 * | 7/2009 | Ikeda | 365/51 |
| 7,763,496 B2 * | 7/2010 | Ikeda et al. | 438/109 |
| 7,779,341 B2 * | 8/2010 | Kim | 714/801 |
| 7,840,876 B2 * | 11/2010 | Sturm et al. | 714/766 |
| 7,949,928 B2 * | 5/2011 | Lee et al. | 714/763 |
| 2006/0174172 A1 * | 8/2006 | Nahas et al. | 714/718 |

FOREIGN PATENT DOCUMENTS

| | | |
|---|---|---|
| KR | 1019990024776 A | 4/1999 |
| KR | 2005159350 | 6/2005 |
| KR | 1020050078259 A | 8/2005 |
| KR | 1020050107813 A | 11/2005 |

* cited by examiner

| Data bits | Error bits | Parity bits | Cell Overhead (%) |
|---|---|---|---|
| 8 | 1 | 4 | 50 % |
| 16 | 1 | 5 | 31 % |
| 32 | 1 | 6 | 18 % |
| 64 | 1 | 7 | 10 % |
| 128 | 1 | 8 | 6 % |

MULTI-LAYER SEMICONDUCTOR MEMORY DEVICE COMPRISING ERROR CHECKING AND CORRECTION (ECC) ENGINE AND RELATED ECC METHOD

CROSS-REFERENCE TO RELATED APPLICATIONS

This application claims priority to Korean Patent Application No. 10-2007-0021171, filed on Mar. 2, 2007, the subject matter of which is hereby incorporated by reference in its entirety.

BACKGROUND OF THE INVENTION

1. Field of the Invention

Embodiments of the invention relate to a semiconductor memory device and a related error checking and correction (ECC) method. In particular, embodiments of the invention relate to a multi-layer semiconductor memory device having an ECC engine and a related ECC method performed using a multi-layer semiconductor memory device.

2. Description of Related Art

Dynamic random access memory (DRAM), non-volatile flash memory, and high-speed static random access memory (SRAM) have become more highly integrated through the use of resistance memory devices such as phase-change random access memory (PRAM), magnetic random access memory (MRAM), resistive random access memory (RRAM), and the like. Thus, resistance memory devices are considered next generation memory. The ability to reduce chip size for conventional memory devices is limited by the transistors that are used as switching elements in those devices. However, there is increasing demand for resistance memory devices having relatively high integration densities and relatively low power consumption.

Therefore, a multi-layer semiconductor memory 100, as illustrated in FIG. 1, has been provided. Referring to FIG. 1, multi-layer semiconductor memory 100 comprises first through third memory cell arrays L1~L3 disposed on a silicon substrate SUB. However, embodying a memory device that uses transistors as switching elements in the form of multi-layer semiconductor memory 100 is difficult. Since transistors are formed on silicon substrate SUB, forming transistors in second and third memory cell arrays L2 and L3 is more difficult.

Therefore, an RRAM including a non-ohmic device is embodied in the form of a multi-layer semiconductor memory device. FIG. 2 is a schematic view of a cell structure of a conventional bi-directional RRAM. Referring to FIG. 2, the bi-directional RRAM includes a non-ohmic device and a resistance variable device. In the RRAM, data is written using resistance-value variations of the resistance variable device. The resistance variable device includes a resistance variable substance disposed between first and second electrodes.

The resistance value of the resistance variable substance varies in accordance with an applied voltage or an applied current. In unidirectional RRAM, the resistance value varies in accordance with the magnitude of the applied voltage or applied current. On the other hand, in the bi-directional RRAM, the resistance value varies in accordance with the magnitude and the direction of the applied voltage or applied current.

The bi-directivity described above is implemented in the bi-directional RRAM illustrated in FIG. 2 by including the non-ohmic device in the bi-directional RRAM. The non-ohmic device is in a high-resistant state in a predetermined voltage range of −3V~3V. Accordingly, a current is not applied to the resistance variable device.

On the other hand, the non-ohmic device is in a low-resistant state outside of the predetermined voltage range of −3V~3V. Accordingly, a current is applied to the resistance variable device outside of that range. U.S. Pat. Nos. 6,909,632 and 6,753,561 disclose a bi-directional RRAM including a non-ohmic device and a resistance variable device in more detail.

FIG. 3 is a graph illustrating cell characteristics of the conventional bi-directional RRAM illustrated in FIG. 2. Referring to FIGS. 2 and 3, when a writing voltage VW of 6V is applied to the resistance variable substance, a corresponding cell has a first resistance. On the other hand, when a writing voltage −VW of −6V is applied to the resistance variable substance, a corresponding cell has a second resistance.

In the bi-directional RRAM, a data value of "1" can be stored when a cell has the first resistance and a data value of "0" can be stored when a cell has the second resistance. That is, in the bi-directional RRAM, the data values "1" and "0" can be written using the writing voltages VW and −VW, wherein the magnitudes of the writing voltages VW and −VW, applied at respective ends of the cell, are the same, but the polarities are different.

FIGS. 4A and 4B are schematic views illustrating write operations in which data is written to a cell of the conventional bi-directional RRAM illustrated in FIG. 2. Referring to FIG. 4A, the data value "0" is written to a cell (illustrated as a circle in FIG. 4) by applying 3V to a word line WL and −3V to a bit line BL. On the other hand, the data value "1" is written to the cell by applying −3V to the word line WL and 3V to the bit line BL. In each of those write operations, 0V is applied to the unselected word line WL' and the unselected bit line BL'.

Referring to FIG. 4B, the data value "0" is written to a cell by applying 6V to a word line WL, 0V to a bit line BL, and 3V to both unselected word line WL' and unselected bit line BL'. On the other hand, the data value "1" is written to the cell by applying 0V to the word line WL, −6V to the bit line BL, and −3V to both the unselected word line WL' and the unselected bit line BL'.

However, when data is written by applying writing voltages VW and −VW (VW=6V, −VW=−6V) to a word line WL or a bit line BL as shown in FIG. 4B, the voltages of an unselected word line WL' and an unselected bit line BL' change in accordance with the data value being written. Thus, writing data by applying ½ writing voltages ½VW and −½VW (½VW=3V, −½VW=−3V) to the word line WL and the bit line BL, respectively, as shown in FIG. 4A, is more efficient.

In addition, layers of RRAM cells (wherein each cell comprises a non-ohmic device) may be readily stacked. Also, the operation of an RRAM device having cells that each comprise a non-ohmic device may be readily controlled, and such an RRAM device can be implemented as a multi-layer memory.

In addition to reducing chip size of a semiconductor memory device, increasing the yield of a semiconductor memory device is also an important consideration. However, weak cells are likely to be produced when there is a geometric increase in capacity of a semiconductor memory device.

A semiconductor memory device comprises a relatively large number of memory cells. However, when there is a defective memory cell among the memory cells of the semiconductor memory device, the device will not operate properly. Therefore, more effective detection and correction of a weak cell are critical issues in increasing the yield of a semiconductor memory device.

To address this issue, many semiconductor memory devices include a redundancy circuit for replacing a weak cell with a redundant cell to increase the yield. Generally, the redundancy circuit drives a redundancy memory cell block having aligned redundant rows and columns and replaces the weak cell with a redundancy cell of the redundancy memory cell block (i.e., uses a redundancy cell of the redundancy memory cell block in place of the weak cell). That is, if an address signal designating the weak cell is input, the redundancy memory cell is selected instead of the weak cell.

However, the redundancy circuit establishes the number of memory cells that can be replaced with redundancy cells in advance and assigns the memory cells near the memory cell block. Thus, if the number of weak cells exceeds the maximum number of redundancy cells, less than all of the weak cells can be replaced. In that case, the semiconductor memory device is finally determined to be defective and revoked. Therefore, having a limited number of redundancy cells limits increasing the yield of a semiconductor memory device.

Alternatively, a semiconductor memory device may have an error checking and correction (ECC) function to increase the yield of the semiconductor memory device.

FIG. 5 is a block diagram of a semiconductor memory device 500 including an ECC engine 540. Referring to FIG. 5, a memory cell array 520 of semiconductor memory device 500 including ECC engine 540 is divided into a payload data region 522 storing payload data NDTA and a parity data region 524 storing parity data PDTA. ECC engine 540 stores parity data PDTA (which corresponds to payload data NDTA) when payload data NDTA is written onto semiconductor memory device 500. In addition, semiconductor memory device 500 performs an ECC operation using parity data PDTA when payload data NDTA is read from semiconductor memory device 500.

Parity data PDTA is established so that the result of performing an exclusive OR (EOR) operation on payload data NDTA and parity data PDTA (i.e., an ECC operation) always has a previously determined value. For example, the previously determined value may be "1" in an odd parity system or "0" in an even parity system. If the result of an ECC operation is a value other than the previously determined value, then ECC engine 540 determines that payload data NDTA is faulty data, corrects payload data NDTA, and outputs the corrected payload data NDTA.

The number of bits of parity data used for the ECC function is selected depending on the ECC performance required. The greater the number of bits of parity data used for error correction, the more errors can be corrected. However, cell overhead increases as the number of bits of parity data used increases.

FIG. 6 is a table illustrating the relationship between the number of bits of payload data and the number of bits of parity data. Referring to FIG. 6, a hamming code is used to correct a 1-bit error. Among 8 data bits, 4 bits of parity data is necessary to correct the 1-bit error. So, for example, 0.5 GB of parity data would be required when storing 1 GB of payload data.

Therefore, an increase in memory size (i.e., cell overhead) occurs due to the amount of data storage space needed for parity data in order to implement the ECC function. Although an increase in the number of bits of parity data can reduce cell overhead, accurate error detection is limited. Moreover, referring to FIG. 5, payload data region 522 and parity data region 524 are disposed on the same plane in the conventional memory device.

SUMMARY OF THE INVENTION

Embodiments of the invention provide a multi-layer semiconductor memory device comprising an error checking and correction (ECC) engine, wherein the multi-layer semiconductor memory device may have a reduced chip size, and provide an ECC method using a multi-layer semiconductor memory device.

In one embodiment, the invention provides a multi-layer semiconductor memory device comprising first and second memory cell array layers, wherein the first memory cell array layer stores first payload data. The multi-layer semiconductor memory device further comprises an error checking and correction (ECC) engine selectively connected to the second memory cell array layer and configured to receive the first payload data, generate first parity data corresponding to the first payload data, and store the first parity data exclusively in the second memory cell array layer.

In another embodiment, the invention provides a method for performing ECC in a multi-layer semiconductor memory device comprising a plurality of memory cell array layers, each comprising a memory cell array. The method comprises storing first payload data in a first memory cell array layer of the plurality of memory cell array layers, storing first parity data corresponding to the first payload data exclusively in a second memory cell array layer of the plurality of memory cell array layers, performing an ECC operation using the first parity data with respect to the first payload data, and performing ECC in accordance with the result of the ECC operation.

BRIEF DESCRIPTION OF THE DRAWINGS

Embodiments of the invention will be described herein with reference to the accompanying drawings, in which.

DESCRIPTION OF EMBODIMENTS

Figure 1:
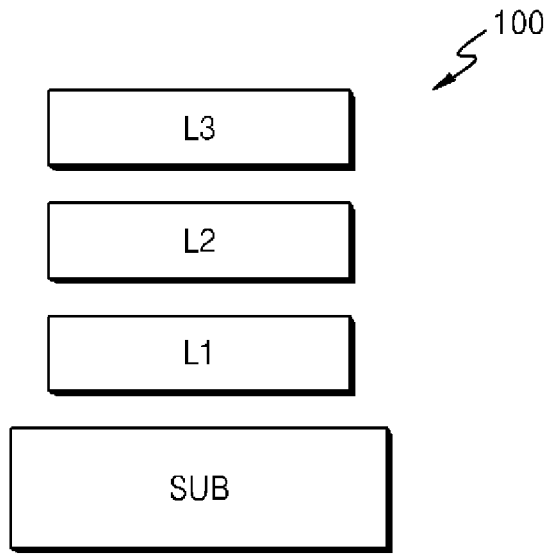
FIG. 1 is a schematic side view of a conventional multi-layer semiconductor memory.
Figure 2:
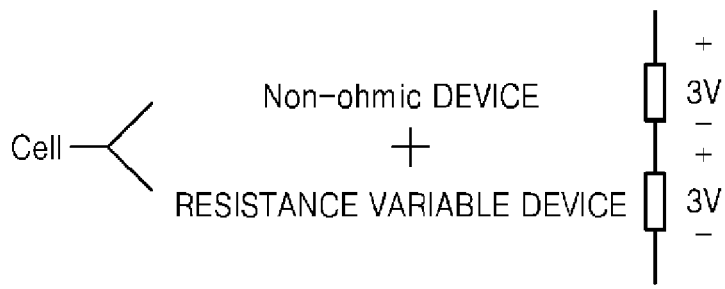
FIG. 2 is a schematic view of a cell structure of a conventional bi-directional resistive random access memory (RRAM)
Figure 3:
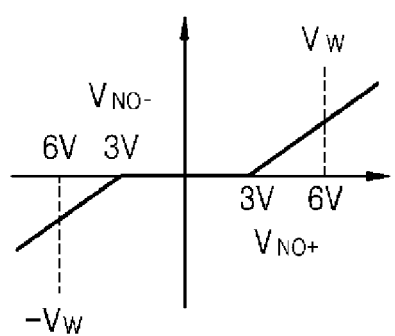
FIG. 3 is a graph illustrating cell characteristics of the conventional bi-directional RRAM illustrated in FIG. 2.
Figure 4:
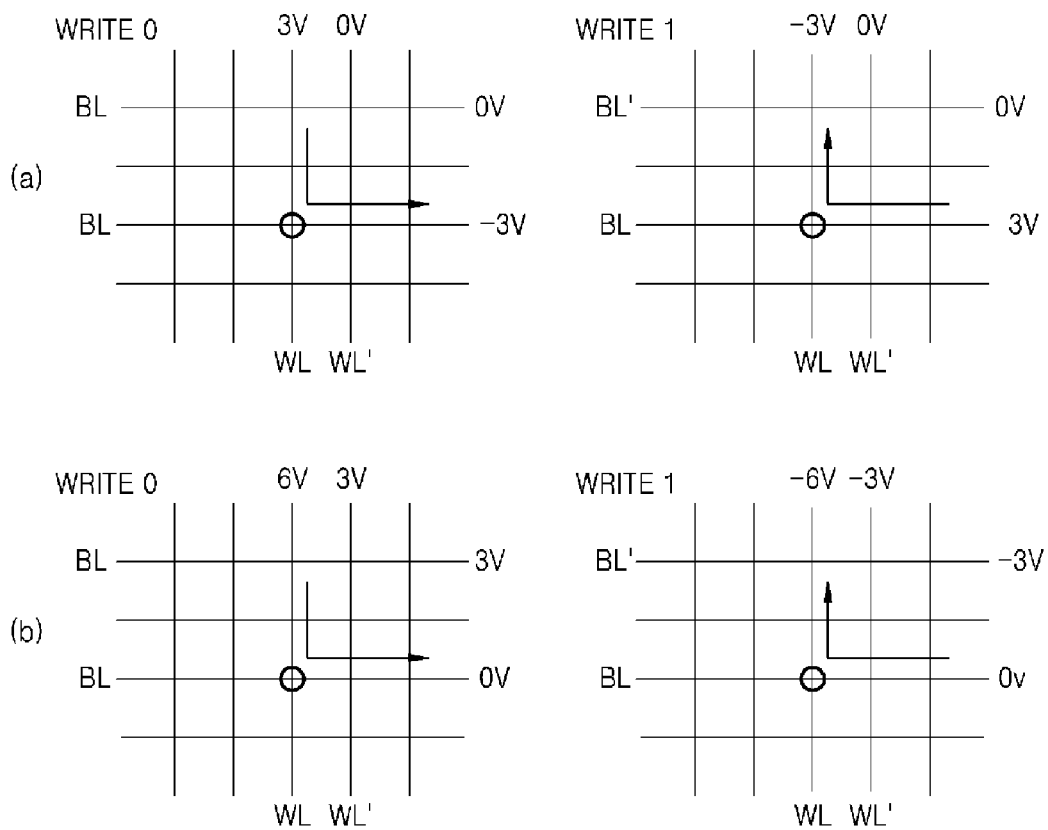
FIGS. 4A and 4B are schematic views illustrating write operations in which data is written to a cell of the conventional bi-directional RRAM illustrated in FIG. 2.
Figures 5, 6:
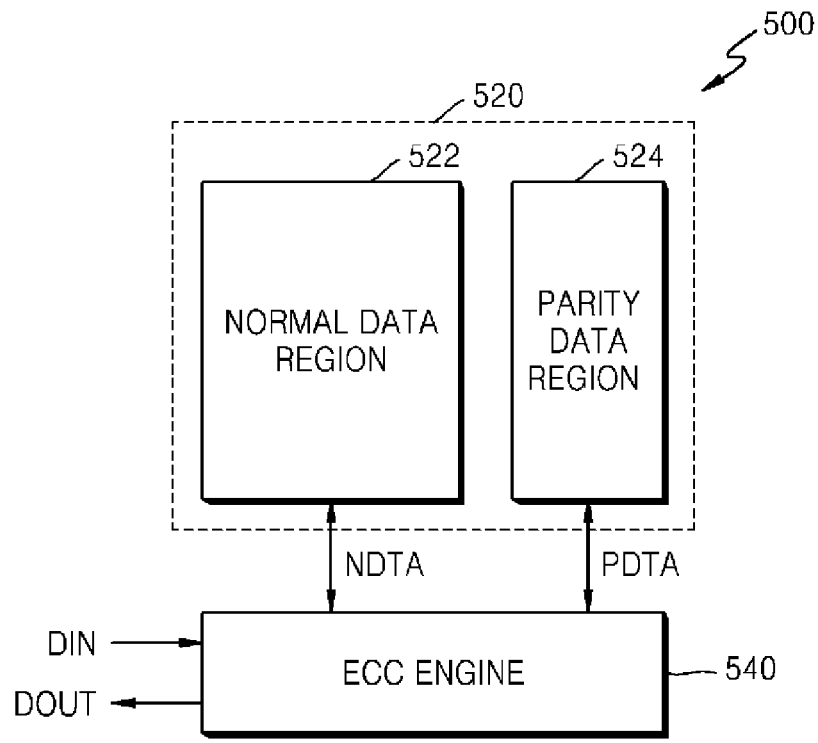
FIG. 5 is a block diagram of a conventional semiconductor memory device including an error checking and correction (ECC) engine.
FIG. 6 is a table illustrating the relationship between the number of bits of payload data and the number of bits of parity data used for ECC.
Figure 7:
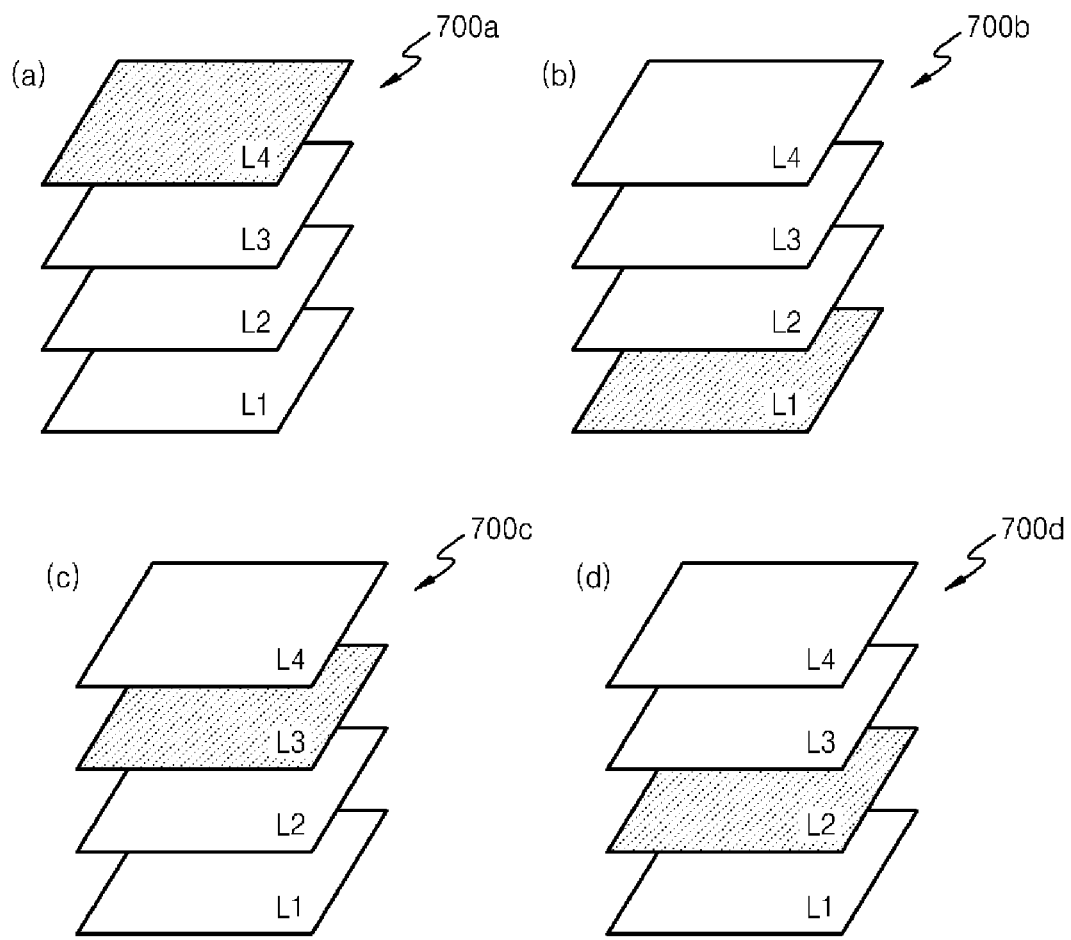
FIGS. 7A through 7D illustrate multi-layer semiconductor memory devices in accordance with embodiments of the invention.

In the drawings, like reference symbols indicate like or similar elements throughout. Hereinafter, embodiments of the invention will be described in the context of a resistive random access memory (RRAM) since RRAM may readily be implemented as a multi-layer semiconductor memory device. In particular, a bi-directional RRAM may be used. However, the invention is not limited to only RRAMs.

FIGS. 7A through 7D illustrate multi-layer semiconductor memory devices 700a, 700b, 700c, and 700d in accordance with embodiments of the invention. Referring to FIGS. 7A through 7D, each of multi-layer semiconductor memory devices 700a, 700b, 700c, and 700d comprises first through third payload memory cell array layers and a parity memory cell array layer. In addition, each memory cell array layer comprises a memory cell array and, as used herein, storing data to a memory cell array layer means storing the data to the memory cell array that the memory cell array layer comprises. As used herein, a "payload" memory cell array layer is a memory cell array layer in which the multi-layer semiconductor memory device stores payload data, and a "parity" memory cell array layer is a memory cell array layer in which the multi-layer semiconductor memory device stores parity data. Also, as used herein "payload" data refers to any data that is not used as parity data, and a parity memory cell array layer may also be referred to as an "ECC layer". In the drawings, differential shading is used to distinguish a parity memory cell array layer or a memory region in which parity data is stored from a payload memory cell array layer or a memory region in which payload data is stored. That is, parity memory cell array layers and memory regions in which parity data is stored ("parity regions") are shaded, while payload memory cell array layers and memory regions in which payload data is stored are not shaded. Additionally, as used herein, one "memory cell array layer" is physically distinct from other memory cell array layers and is disposed in a different plane than other memory cell array layers. Thus, as used herein, first and second memory cell array layers, for example, are physically distinct layers disposed within different planes.

In each of multi-layer semiconductor memory devices 700a, 700b, 700c, and 700d, payload data is stored in the first through third payload memory cell array layers, and parity data is stored in the parity memory cell array layer, which is a separate layer with respect to the first through third payload memory cell array layers. Although the embodiments illustrated in FIGS. 7A through 7D each comprise four memory cell array layers, a multi-layer semiconductor memory device in accordance with an embodiment of the invention may comprise more than four memory cell array layers.

Referring to FIG. 7A, a parity memory cell array layer L4 is disposed on the top of multi-layer semiconductor memory device 700a. Referring to FIG. 7B, a parity memory cell array layer L1 is disposed at the bottom of multi-layer semiconductor memory device 700b. In addition, referring to FIG. 7C, a parity memory cell array layer L4 is disposed between a second payload memory cell array layer L2 and a third payload memory cell array layer L4 of multi-layer semiconductor memory device 700c. Also, referring to FIG. 7D, a parity memory cell array layer L2 is disposed between a first payload memory cell array layer L1 and a second payload memory cell array layer L3 of multi-layer semiconductor memory device 700d.

Figure 8:
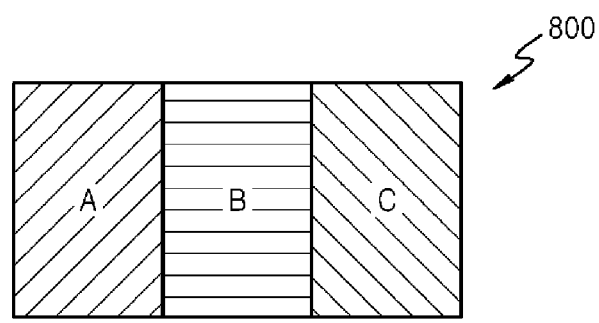
FIG. 8 illustrates a parity memory cell array which corresponds to parity memory cell arrays of parity memory cell array layers illustrated in FIGS. 7A through 7D.

FIG. 8 illustrates a parity memory cell array 800, which corresponds to the parity memory cell arrays of the parity memory cell array layers illustrated in FIGS. 7A through 7D. Referring to FIG. 8, parity memory cell array 800 comprises first, second, and third sub-regions A, B, and C, and parity data corresponding to payload data stored in the first, second, and third payload memory cell array layers is stored in the first, second, and third sub-regions A, B, and C, respectively. For example, referring to FIG. 7A, parity memory cell array layer L4 comprises a parity memory cell array comprising sub-regions A, B, and C. That parity memory cell array stores parity data corresponding to payload data stored in the first payload memory cell array layer L1 in first sub-region A, stores parity data corresponding to payload data stored in the second payload memory cell array layer L2 in second sub-region B, and stores parity data corresponding to payload data stored in the third payload memory cell array layer L3 in third sub-region C.

Figure 9:
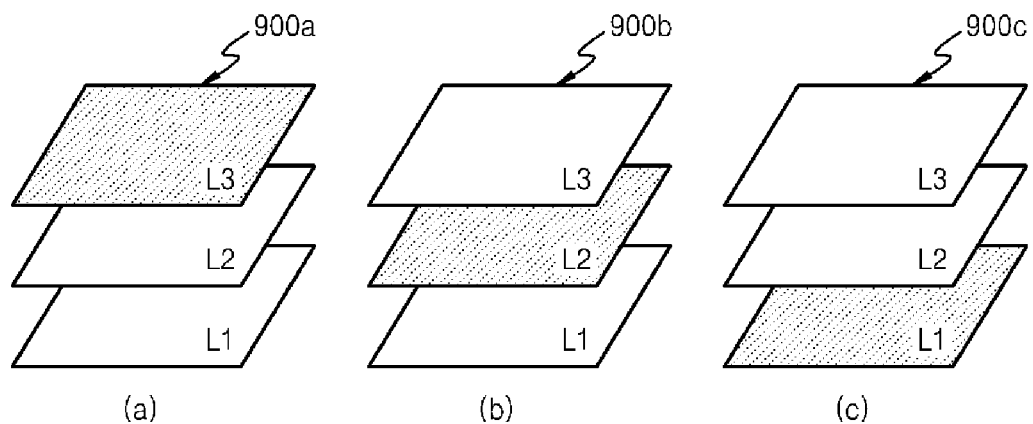
FIGS. 9A through 9C illustrate multi-layer semiconductor memory devices in accordance with embodiments of the invention.

FIGS. 9A through 9C illustrate multi-layer semiconductor memory devices in accordance with embodiments of the invention. Referring to FIGS. 9A through 9C, multi-layer semiconductor memory devices 900a, 900b, and 900c do not include a separate memory cell array storing parity data, unlike multi-layer semiconductor memory devices 700a, 700b, 700c, and 700d, but use one of the memory cell array layers as a parity memory cell array layer.

In more detail, referring to FIG. 9A, a third memory cell array layer L3 is used as a parity memory cell array layer, and first and second memory cell array layers L1 and L2 are used as payload memory cell array layers. Referring to FIG. 9B, a second memory cell array layer L2 is used as a parity memory cell array layer, and first and third memory cell array layers L1 and L3 are used as payload memory cell array layers. Also, referring to FIG. 9C, a first memory cell array layer L1 is used as a parity cell array layer, and second and third memory cell array layers L2 and L3 are used as payload memory cell array layers.

Figure 10:
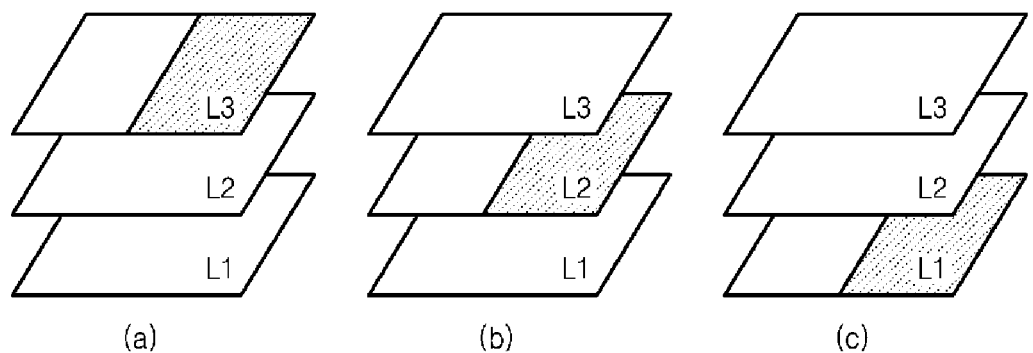
FIGS. 10A through 10C illustrate multi-layer semiconductor memory devices in accordance with embodiments of the invention.

FIGS. 10A through 10C illustrate multi-layer semiconductor memory devices in accordance with embodiments of the invention. Referring to FIGS. 10A through 10C, parity data is stored in a parity region of a memory cell array of at least one of first through third memory cell array layers L1-L3. Although, in the embodiments illustrated in FIGS. 10A to 10C, each of the illustrated multi-layer semiconductor memory devices comprises three memory cell array layers, a multi-layer semiconductor memory device may comprise four or more memory cell array layers, like multi-layer semiconductor memory devices 700a, 700b, 700c, and 700d illustrated in FIGS. 7A through 7D. In addition, as described with reference to FIG. 8, and like the parity memory cell arrays of the parity memory cell array layers of the embodiments illustrated in FIGS. 7A through 7D, each of the parity memory cell arrays of the embodiments illustrated in FIGS. 9A-9C may comprise separate sub-regions respectively storing parity data corresponding to payload data stored in different memory cell array layers. In addition, in each of the embodiments illustrated in FIGS. 10A-10C, the portion of a memory cell array in which parity data is stored may comprise separate sub-regions respectively storing parity data corresponding to payload data stored in different memory cell array layers.

Figure 11:
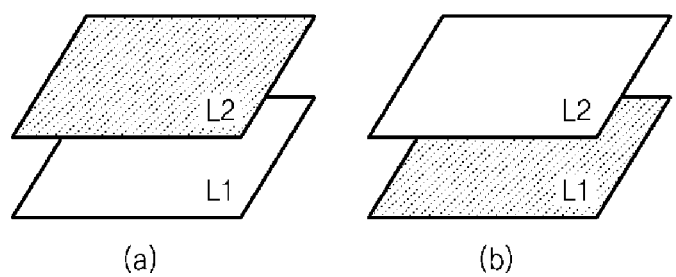
FIGS. 11A and 11B illustrate multi-layer semiconductor memory devices in accordance with embodiments of the invention.

FIGS. 11A and 11B illustrate multi-layer semiconductor memory devices in accordance with embodiments of the invention. The multi-layer semiconductor memory devices illustrated in FIGS. 11A and 11B each comprise a payload memory cell array layer comprising a memory cell array storing payload data and a parity memory cell array layer comprising a memory cell array storing parity data, wherein the payload memory cell array layer is separate from the parity memory cell array layer. In more detail, referring to FIG. 11A, a parity memory cell array layer L2 is disposed on a payload memory cell array layer L1 of the multi-layer semiconductor memory device. In addition, referring to FIG. 11B, a payload memory cell array layer L2 is disposed on a parity memory cell array layer L1 of the multi-layer semiconductor memory device.

The parity memory cell arrays or parity regions in which parity data is stored in the multi-layer semiconductor memory devices illustrated in FIGS. 7 through 11 can be changed into payload memory cell arrays or payload regions in which payload data is stored in response to a selection signal. The selection signal can be established using magnetic resonance spectroscopy (MRS) or by fuse cutting by a user.

A multi-layer semiconductor memory device in accordance with an embodiment of the invention may comprise a parity cell array used for an ECC function, wherein the parity cell array is formed on a different layer than the payload cell arrays of the device, to reduce chip size of the multi-layer semiconductor memory device.

Figure 12:
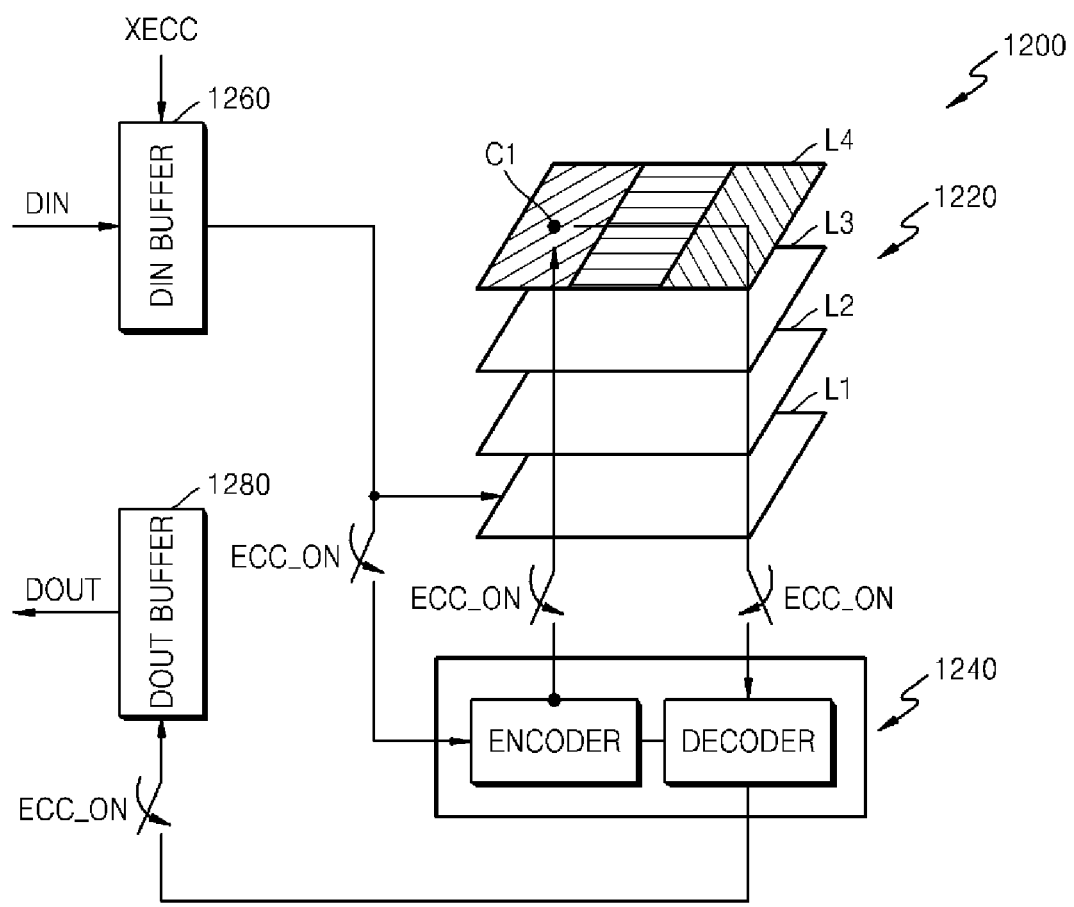
FIG. 12 illustrates a multi-layer semiconductor memory device in accordance with an embodiment of the invention.
Figure 13:
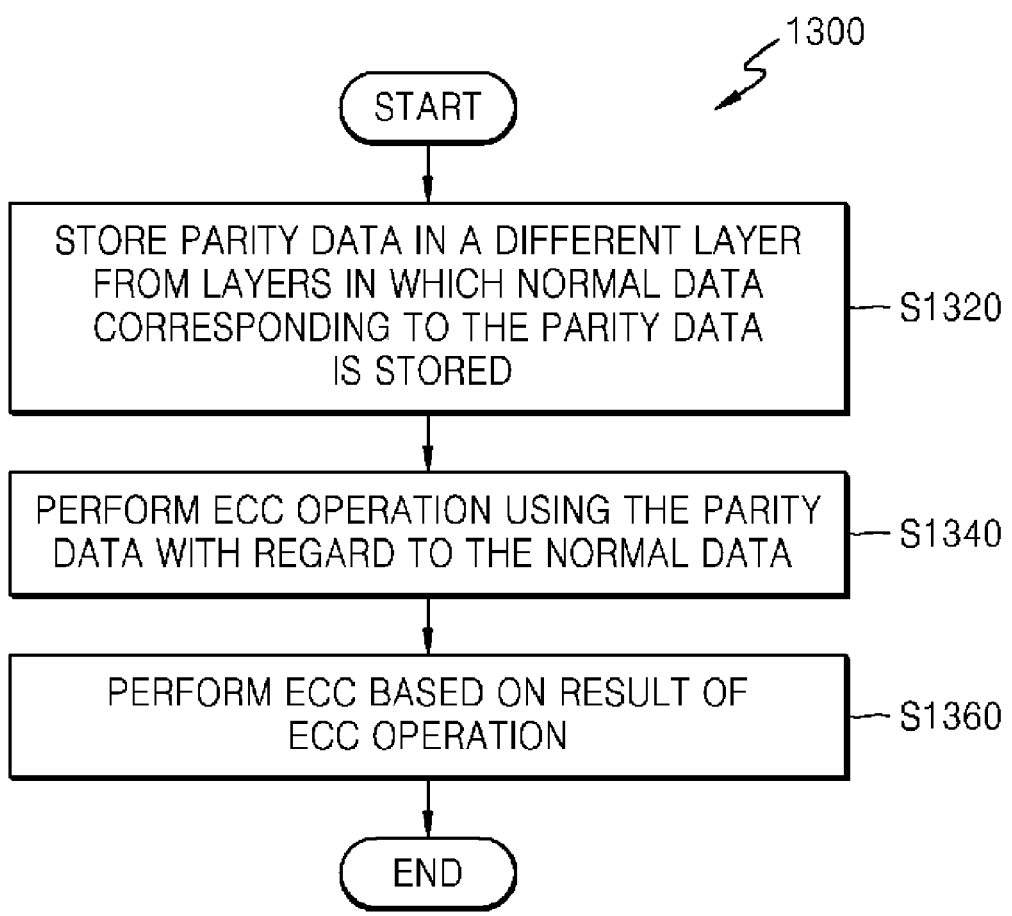
FIG. 13 is a flowchart illustrating an ECC method in accordance with an embodiment of the invention.

FIG. 12 illustrates a multi-layer semiconductor memory device 1200 in accordance with an embodiment of the invention. FIG. 13 is a flowchart for an ECC method 1300, which will be described with reference to FIG. 12. Referring to FIGS. 12 and 13, ECC method 1300 comprises storing parity data in a memory cell array layer different from the memory cell array layers in which payload data corresponding to the parity data is stored (operation S1320). In particular, ECC method 1300 comprises storing parity data in a memory cell array layer L4 of multi-layer semiconductor memory device 1200, while payload data corresponding to the parity data is stored in memory cell array layers L1~L3. ECC method 1300 further comprises performing an ECC operation with regard to the payload data using the parity data (operation S1340), and performing ECC based on the result of the ECC operation (operation S1360).

When the payload data is written to multi-layer semiconductor memory device 1200, an ECC engine 1240 stores the parity data corresponding to the payload data in a memory cell array layer L4. In FIG. 12, C1 denotes a memory cell. In addition, ECC engine 1240 performs the ECC operation using the parity data when the payload data is read from multi-layer semiconductor memory device 1200, and performs ECC. The ECC operation has been described above.

Multi-layer semiconductor memory device 1200 receives a user command XECC in a user mode, and changes the memory cell array of memory cell array layer L4 from a parity memory cell array into a payload memory cell array. In more detail, a selection signal ECC_ON is inactivated in response to the activation of user command XECC, and paths between ECC engine 1240 and parity memory cell array layer L4 are disconnected in response to selection signal ECC_ON being inactivated (i.e., switches on those paths are turned OFF). Multi-layer semiconductor memory device 1200 also comprises data input buffer 1260 and data output buffer 1280.

Multi-layer semiconductor memory device 1200 comprises memory cell array layers 1220 having an arrangement that corresponds to the arrangement of the memory cell array layers in the multi-layer semiconductor memory device illustrated in FIG. 7A. However, memory cell array layers 1220 may have other arrangements as well.

Figure 14:
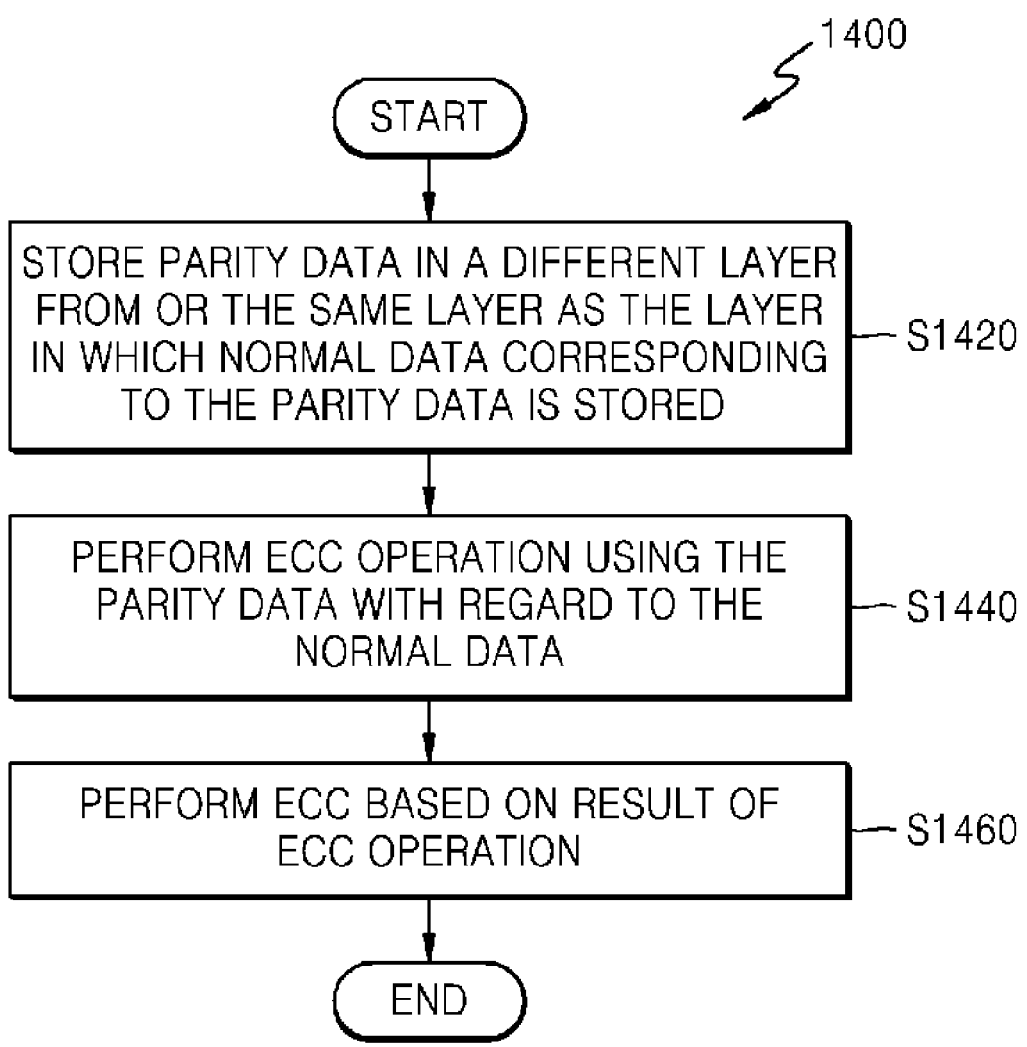
FIG. 14 is a flowchart illustrating another ECC method in accordance with an embodiment of the invention.

FIG. 14 is a flowchart illustrating an ECC method 1400 for a multi-layer semiconductor memory device in accordance with an embodiment of the invention. Referring to FIG. 14, ECC method 1400 is similar to ECC method 1300 illustrated in FIG. 13. However, in ECC method 1400, parity data is stored in a memory cell array of a memory cell array layer that is either different from or the same as the memory cell array layer in which payload data corresponding to the parity data is stored (Operation 1420). ECC method 1400 can be applied to a multi-layer semiconductor memory device having a memory cell array structure like the ones illustrated in FIG. 10.

In accordance with embodiments of the invention, a multi-layer semiconductor memory device comprises a parity memory cell array storing parity data and used for an ECC function, wherein the memory cell array layer comprising the parity memory cell array is different from the memory cell array layer storing the payload data.

Although embodiments of the invention have been described herein, various changes may be made in form and details of the embodiments by one of ordinary skill in the art without departing from the scope of the invention as defined by the accompanying claims.

What is claimed is:

1. A multi-layer semiconductor memory device comprising:
    a multi-layer memory cell array comprising a plurality of semiconductor layers vertically stacked one upon the other, and including a first semiconductor layer including a first memory cell array of non-volatile memory cells storing only payload data, and a second semiconductor layer including a second memory cell array of non-volatile memory cells storing only parity data derived from the payload data; and
    an error checking and correction (ECC) engine selectively connected to the second memory cell array of the multi-layer memory cell array, and configured to receive the payload data, derive the parity data from the payload data, and then write the parity data in only the second memory cell array.

2. The multi-layer semiconductor memory device of claim 1, further comprising switches connecting/disconnecting the ECC engine from the second memory cell array in response to a command signal.

3. The multi-layer semiconductor memory device of claim 1, wherein the ECC engine is further configured to write the parity data in the second memory cell array layer when the payload data is written to the first memory cell array.

4. The multi-layer semiconductor memory device of claim 1, wherein the first semiconductor layer is vertically stacked over the second semiconductor layer in the plurality of semiconductor layers.

5. The multi-layer semiconductor memory device of claim 1, wherein the second semiconductor layer is vertically stacked over the first semiconductor layer in the plurality of semiconductor layers.

6. The multi-layer semiconductor memory device of claim 1, wherein the plurality of semiconductor layers further includes a third semiconductor layer including a third memory cell array of non-volatile memory cells storing only payload data.

7. The multi-layer semiconductor memory device of claim 6, wherein the second semiconductor layer is disposed between the first and third memory semiconductor layers.

8. The multi-layer semiconductor memory device of claim 6, wherein the second memory cell array comprises first and second sub-regions, and
   the ECC engine is further configured to derive first parity data from the payload data stored in the first memory cell array and then store the first parity data in the first sub-region, and derive second parity data from the payload data stored in the third memory cell array and then store the second parity data in the second sub-region.

9. The multi-layer semiconductor memory device of claim 1, wherein the non-volatile memory cells are resistive random access memory (RRAM) cells.

10. The multi-layer semiconductor memory device of claim 1, wherein the ECC engine is further configured to read the parity data from the second memory cell array layer when the payload data is read from the first memory cell array and perform an ECC operation on the payload data using the parity data.

* * * * *